United States Patent
Chen et al.

(10) Patent No.: US 10,246,636 B1
(45) Date of Patent: Apr. 2, 2019

(54) LED DEVICE

(71) Applicant: LEEDARSON LIGHTING CO. LTD., Zhangzhou, Fujian (CN)

(72) Inventors: Yanbiao Chen, Xiamen (CN); Liangliang Cao, Xiamen (CN); Huiwu Chen, Xiamen (CN); Qiyuan Wang, Xiamen (CN)

(73) Assignee: LEEDARSON LIGHTING CO. LTD., Zhangzhou, Fujian (CN)

( * ) Notice: Subject to any disclaimer, the term of this patent is extended or adjusted under 35 U.S.C. 154(b) by 0 days.

(21) Appl. No.: 15/886,801

(22) Filed: Feb. 1, 2018

(30) Foreign Application Priority Data

Jan. 16, 2018 (CN) .................... 2018 2 0071681 U

(51) Int. Cl.
| | | |
|---|---|---|
| *C08K 3/34* | (2006.01) | |
| *F21K 9/64* | (2016.01) | |
| *C09K 11/08* | (2006.01) | |
| *C09K 11/59* | (2006.01) | |
| *H01L 33/50* | (2010.01) | |
| *H01L 33/52* | (2010.01) | |

(52) U.S. Cl.
CPC ............ *C09K 11/0883* (2013.01); *C08K 3/34* (2013.01); *C09K 11/59* (2013.01); *F21K 9/64* (2016.08); *H01L 33/50* (2013.01); *H01L 33/52* (2013.01)

(58) Field of Classification Search
CPC ..... C09K 11/0883; C09K 11/02; C09K 11/06; C09K 11/08; C09K 11/59; H01L 33/52; H01L 33/50; F21K 9/64; F21K 9/56; F21K 2099/005; C08K 3/34
See application file for complete search history.

(56) References Cited

U.S. PATENT DOCUMENTS

| | | | | |
|---|---|---|---|---|
| 2009/0272996 A1* | 11/2009 | Chakraborty | ......... | H01L 33/501 257/98 |
| 2011/0147775 A1* | 6/2011 | Hikosaka | ................ | H01L 33/50 257/98 |
| 2014/0061683 A1* | 3/2014 | Chang | ..................... | H01L 33/52 257/88 |
| 2014/0246689 A1* | 9/2014 | Luo | ........................ | H01L 33/504 257/98 |
| 2014/0319553 A1* | 10/2014 | Ye | ........................ | H01L 33/0004 257/89 |
| 2015/0318451 A1* | 11/2015 | Ishida | ................ | C09K 11/7734 257/98 |
| 2016/0072026 A1* | 3/2016 | Kanaumi | .............. | H01L 33/507 257/98 |
| 2016/0322543 A1* | 11/2016 | Jeon | ........................ | H01L 33/505 |
| 2017/0051157 A1* | 2/2017 | Chaloner-Gill | .......... | C08K 3/34 |

* cited by examiner

*Primary Examiner* — Joseph L Williams
*Assistant Examiner* — Jose M Diaz
(74) *Attorney, Agent, or Firm* — Chun-Ming Shih

(57) ABSTRACT

A LED device includes LED chips mounted on a substrate, a first fluorescent layer, a second fluorescent layer and a package housing. The LED chips emit a blue light. The first fluorescent layer has a first side facing to the LED chips for converting the blue light to a red light. The second fluorescent layer has a first side attached to a second side of the first fluorescent layer for converting the blue light to a red light emitted from a second side of the second fluorescent layer. The package housing holds the substrate and the first fluorescent layer.

19 Claims, 8 Drawing Sheets

LED DEVICE

FIELD OF THE INVENTION

The present invention is related to a LED (light emitted diode) device and more particularly related to a LED device using multiple types of phosphor materials.

BACKGROUND

After years of hard working, LED products have been widely spread over the world. At beginning, the cost of LED products is too high, preventing LED products to be popular. Nowadays, LED product price has lowered to an acceptable level.

However, it is always important to further find every aspect to improve such devices, particularly for such worldwide products related to human daily life. Heat efficiency, color rendering index, and more characteristics need to consider when designing LED devices.

In the present invention, inventors look deeper into the LED basic structure and finds several inventive points to further improve LED device performance.

SUMMARY OF INVENTION

According to a first embodiment of the present invention, a LED (light emitted diode) device is provided. The LED device has a LED module, a first fluorescent layer, a second fluorescent layer, and a package housing.

The LED module is mounted on a substrate for emitting a blue light.

The first fluorescent layer has a first side facing to the LED module for converting the blue light to a red light.

The second fluorescent layer has a first side attached to a second side of the first fluorescent layer for converting the blue light to a red light emitted from a second side of the second fluorescent layer.

The package housing holds the substrate and the first fluorescent layer.

With such design, the first fluorescent layer is between the second fluorescent layer and the LED module. In other words, a blue light emitted from the LED module firstly enters the first fluorescent layer, hitting certain phosphor material and generating corresponding red light. In addition, some part of the blue light further moves to the second fluorescent layer to hit other phosphor material to generate green light. With red light and green light, users may see a white light effect.

In some embodiments, the LED module has multiple LED chips emitting the blue light. The substrate has a first terminal area and a second terminal area for mounting the multiple LED chips. For example, multiple LED chips are mounted on conductive plates used as the terminal areas with surface mounting device (SMD) technology.

The first terminal area and the second terminal area are provided for respectively connected to a positive terminal and a negative terminal of a power source. The first terminal area may have different size as the second terminal area. For example, when there are more LED chips mounted on the first terminal area than on the second terminal area, the first terminal area may have a larger size than the second terminal area to provide better heat dissipation effect.

In some embodiments, the first fluorescent has red phosphor material contained in first silicone part, and the second fluorescent layer has green phosphor material contained in a second silicone part. Please be noted that other materials in addition to silica gel, like resin, may be used for containing phosphor powder.

In addition, a part of the green light may excite the red phosphor if the green light hits the red phosphor. In other words, if the blue light firstly enters the second fluorescent layer, the blue light may firstly be converted to green light. If such green light continues to move into the first fluorescent layer, part or all of the green light may be consumed and converted into red light. This may decrease the overall green light energy and decreases an overall CRI (color rendering index) of the LED device.

Therefore, it is beneficial to place the first fluorescent layer between the second fluorescent layer and the LED module, for improving green light output and decreasing undesired consumption of the green light output.

Inventors also find that there the volume ratio of phosphor material in the first fluorescent layer and the second fluorescent layer may be adjusted to further improve different characteristics of the LED device.

In some cases, a first volume ratio of the red phosphor to the first silicone part is larger than a second volume ratio of the green phosphor to the second silicone part.

In some other cases, a first volume ratio of the red phosphor to the first silicone part is smaller than a second volume ratio of the green phosphor to the second silicone part.

The provide different features and characteristics, suitable for making various LED products.

In some embodiments, a thickness of the first fluorescent layer is larger than a thickness of the second fluorescent layer.

In some other embodiments, a thickness of the first fluorescent layer is smaller than a thickness of the second fluorescent layer.

Such variations are found helpful for adjusting product characteristic of the LED device.

In addition, the first fluorescent layer may have better heat resisting feature than the second fluorescent layer, when the first fluorescent layer is placed closer to the LED module. In other words, designers may place phosphor material with less heat resisting characteristic as the second fluorescent layer.

In some embodiments, the package housing may have a bottom part fixed to the substrate and the package housing has a surrounding wall extended from the bottom part. The wall defines a containing space for holding the first fluorescent layer.

For example, the package housing has a hole for holding the substrate and four connecting walls forming a rectangular containing space. The first fluorescent layer and sometimes the second florescent layer are placed in the containing space.

There are several ways to design the second fluorescent layer.

In some embodiments, a second side of the second fluorescent layer has a curved surface. In other words, the top surface of the second fluorescent layer may have a curve surface.

Specifically, an angle of edges of the first side and the second side of the second fluorescent layer would be less than 60 degrees. Such design may increase overall product stability.

In some embodiments, the curve surface forms a convex lens, providing better optical characteristic for output light, by directing light to desired direction.

In some other embodiments, area of the second side of the second fluorescent layer is smaller than area of the second side of the first fluorescent layer. In other words, when being looked over a top view, a part of the second side of the first fluorescent layer is exposed and uncovered by the second fluorescent layer.

In such case, there is an embodiment to place the second fluorescent in the middle place, which causes the second side of second fluorescent layer being surrounded by the second side of the first fluorescent layer from a top view.

In some embodiments, the package housing has a ladder wall for engaging with a peripheral part of the second fluorescent layer. In some manufacturing procedures, the first fluorescent layer and the second fluorescent layer are heated as gel mode to be filled into the package holding. When the package holding has a ladder wall, the first fluorescent layer may be filled in a first ladder while the second fluorescent layer may be filled to in a second ladder upper than the first ladder in the ladder wall.

In some embodiments, the second side of the second fluorescent layer forms a flat surface.

In some other embodiments, the second side of second florescent layer forms a curve surface for different optical characteristic requirement.

In some embodiments, the second side of the second fluorescent layer may have multiple convex part corresponding to multiple underlying LED chips of the LED module. It may be implemented by applying gel mode material of the second fluorescent layer to the package for several times respectively to underlying LED chips. Because LED chips usually have certain light emitting angle, it is helpful to maximize the light converting effect by placing more material of the second fluorescent layer on top of corresponding LED chips, particularly when phosphor material is critical cost in LED devices.

DETAILED DESCRIPTION

Figure 1:
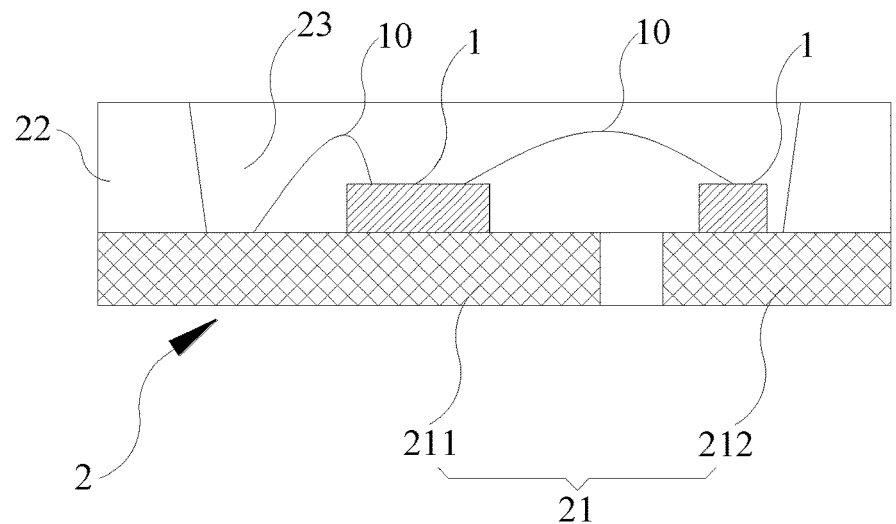
FIG. 1 is a diagram illustrating a LED device embodiment.
Figure 2:
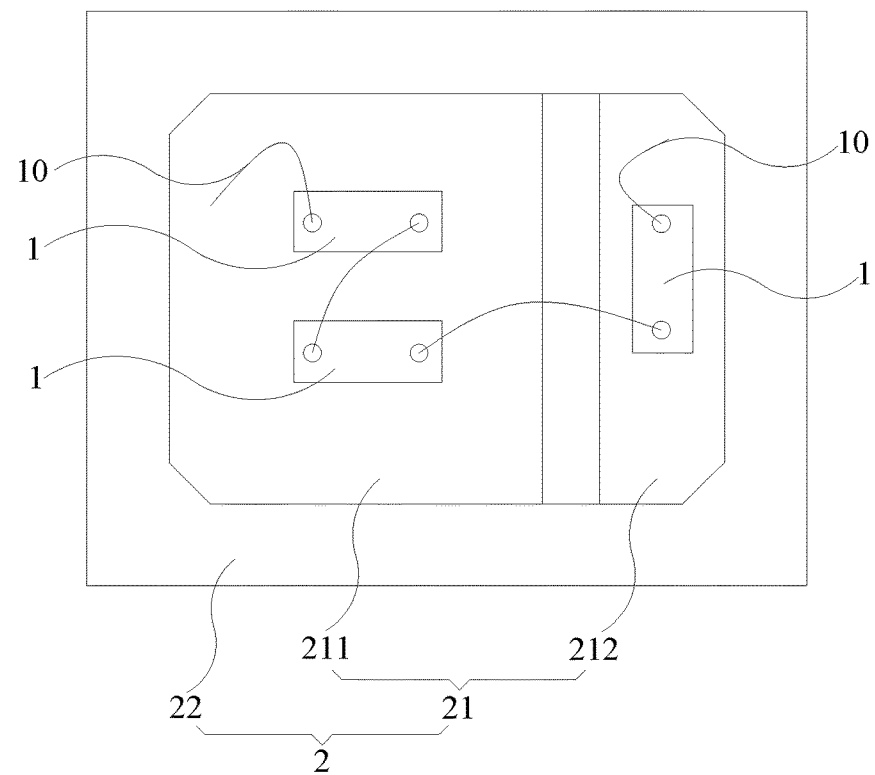
FIG. 2 is a top view of FIG. 1.
Figure 3:
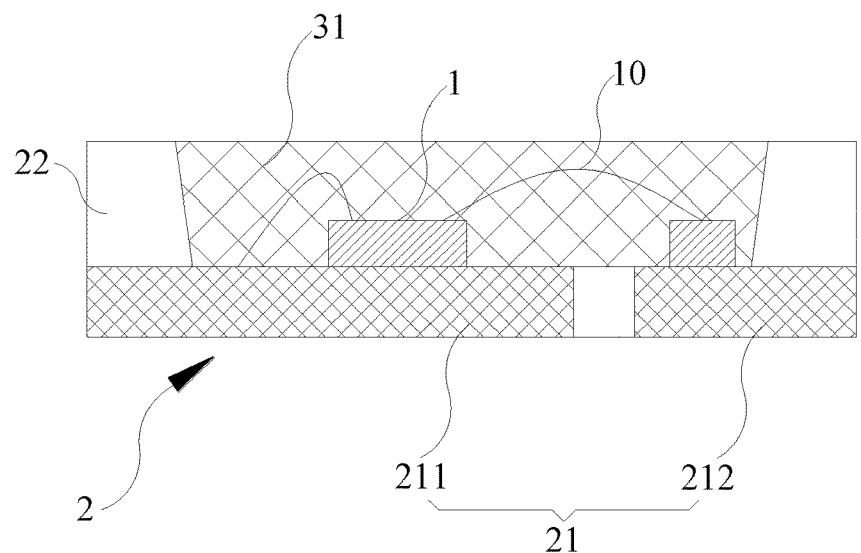
FIG. 3. Illustrates a first fluorescent layer installed in a LED device embodiment.
Figure 4:
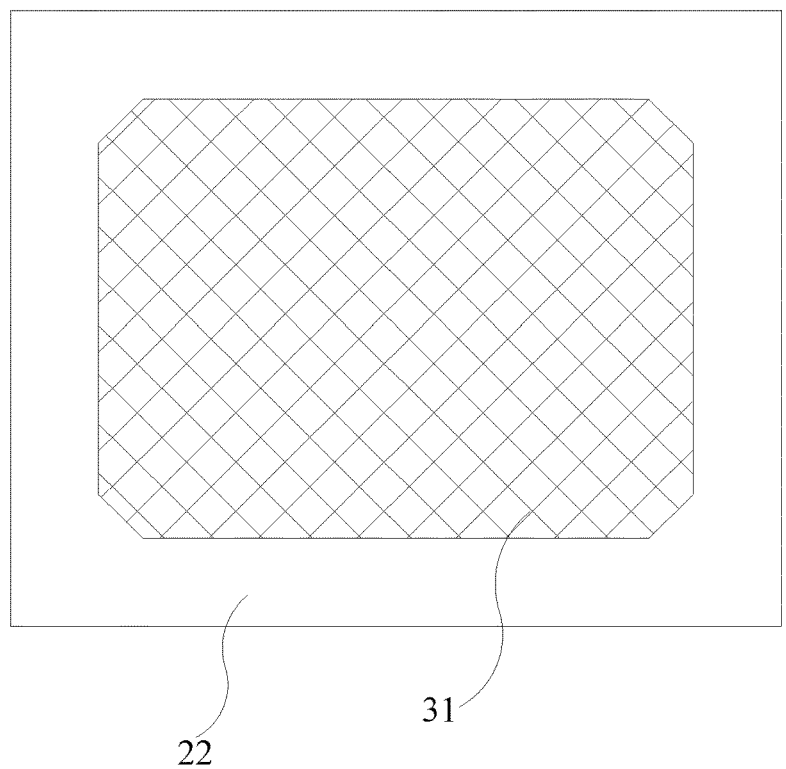
FIG. 4 illustrates a top view of FIG. 3.

According to a first embodiment of the present invention, a LED (light emitted diode) device is provided. The LED device has a LED module, a first fluorescent layer, a second fluorescent layer, and a package housing.

The LED module is mounted on a substrate for emitting a blue light.

The first fluorescent layer has a first side facing to the LED module for converting the blue light to a red light.

The second fluorescent layer has a first side attached to a second side of the first fluorescent layer for converting the blue light to a green light emitted from a second side of the second fluorescent layer.

The package housing holds the substrate and the first fluorescent layer.

With such design, the first fluorescent layer is between the second fluorescent layer and the LED module. In other words, a blue light emitted from the LED module firstly enters the first fluorescent layer, hitting certain phosphor material and generating corresponding red light. In addition, some part of the blue light further moves to the second fluorescent layer to hit other phosphor material to generate green light. With red light and green light, users may see a white light effect.

In some embodiments, the LED module has multiple LED chips emitting the blue light. The substrate has a first terminal area and a second terminal area for mounting the multiple LED chips. For example, multiple LED chips are mounted on conductive plates used as the terminal areas with surface mounting device (SMD) technology.

The first terminal area and the second terminal area are provided for respectively connected to a positive terminal and a negative terminal of a power source. The first terminal area may have different size as the second terminal area. For example, when there are more LED chips mounted on the first terminal area than on the second terminal area, the first terminal area may have a larger size than the second terminal area to provide better heat dissipation effect.

In some embodiments, the first fluorescent has red phosphor material contained in first silicone part, and the second fluorescent layer has green phosphor material contained in a second silicone part. Please be noted that other materials in addition to silica gel, like resin, may be used for containing phosphor powder.

In addition, a part of the green light may excite the red phosphor if the green light hits the red phosphor. In other words, if the blue light firstly enters the second fluorescent layer, the blue light may firstly be converted to green light. If such green light continues to move into the first fluorescent layer, part or all of the green light may be consumed and converted into red light. This may decrease the overall green light energy and decreases an overall CRI (color rendering index) of the LED device.

Therefore, it is beneficial to place the first fluorescent layer between the second fluorescent layer and the LED module, for improving green light output and decreasing undesired consumption of the green light output.

Inventors also find that there the volume ratio of phosphor material in the first fluorescent layer and the second fluorescent layer may be adjusted to further improve different characteristics of the LED device.

In some cases, a first volume ratio of the red phosphor to the first silicone part is larger than a second volume ratio of the green phosphor to the second silicone part.

In some other cases, a first volume ratio of the red phosphor to the first silicone part is smaller than a second volume ratio of the green phosphor to the second silicone part.

The provide different features and characteristics, suitable for making various LED products.

In some embodiments, a thickness of the first fluorescent layer is larger than a thickness of the second fluorescent layer.

In some other embodiments, a thickness of the first fluorescent layer is smaller than a thickness of the second fluorescent layer.

Such variations are found helpful for adjusting product characteristic of the LED device.

In addition, the first fluorescent layer may have better heat resisting feature than the second fluorescent layer, when the first fluorescent layer is placed closer to the LED module. In other words, designers may place phosphor material with less heat resisting characteristic as the second fluorescent layer.

In some embodiments, the package housing may have a bottom part fixed to the substrate and the package housing has a surrounding wall extended from the bottom part. The wall defines a containing space for holding the first fluorescent layer.

For example, the package housing has a hole for holding the substrate and four connecting walls forming a rectangular containing space. The first fluorescent layer and sometimes the second florescent layer are placed in the containing space.

There are several ways to design the second fluorescent layer.

In some embodiments, a second side of the second fluorescent layer has a curved surface. In other words, the top surface of the second fluorescent layer may have a curve surface.

Specifically, an angle of edges of the first side and the second side of the second fluorescent layer would be less than 60 degrees. Such design may increase overall product stability.

In some embodiments, the curve surface forms a convex lens, providing better optical characteristic for output light, by directing light to desired direction.

In some other embodiments, area of the second side of the second fluorescent layer is smaller than area of the second side of the first fluorescent layer. In other words, when being looked over a top view, a part of the second side of the first fluorescent layer is exposed and uncovered by the second fluorescent layer.

In such case, there is an embodiment to place the second fluorescent in the middle place, which causes the second side of second fluorescent layer being surrounded by the second side of the first fluorescent layer from a top view.

In some embodiments, the package housing has a ladder wall for engaging with a peripheral part of the second fluorescent layer. In some manufacturing procedures, the first fluorescent layer and the second fluorescent layer are heated as gel mode to be filled into the package holding. When the package holding has a ladder wall, the first fluorescent layer may be filled in a first ladder while the second fluorescent layer may be filled to in a second ladder upper than the first ladder in the ladder wall.

In some embodiments, the second side of the second fluorescent layer forms a flat surface.

In some other embodiments, the second side of second florescent layer forms a curve surface for different optical characteristic requirement.

In some embodiments, the second side of the second fluorescent layer may have multiple convex part corresponding to multiple underlying LED chips of the LED module. It may be implemented by applying gel mode material of the second fluorescent layer to the package for several times respectively to underlying LED chips. Because LED chips usually have certain light emitting angle, it is helpful to maximize the light converting effect by placing more material of the second fluorescent layer on top of corresponding LED chips, particularly when phosphor material is critical cost in LED devices.

Please refer to FIG. 1 to FIG. 6, illustrating a LED device embodiment.

The LED device has LED chips 1 and a bracket 2 for fixing the LED chips 1. The LED bracket 2 contains a substrate 21 and four side walls 22 as a package housing. The substrate 21 and the side walls 22 form a containing space 23.

A first terminal area 211 and a second terminal area 212 are disposed on the substrate. The LED chips 1 are placed in the containing space 23 and mounted on surface of the first terminal area 211 and the second terminal area 212, e.g. via surface mounting device (SMD) technology. The LED chips 1 may be electrically connected in series or in other combination. The first terminal area 211 and the second terminal 212 are further electrically connected to a power source to supply electricity to the LED chips 1.

A first fluorescent layer 31 is disposed for covering the LED chips 1. A second fluorescent layer 32 is on top of the first fluorescent layer 31. The wave length of emitted light of the first fluorescent layer 31 is longer than the wave length of emitted light of the second fluorescent layer 32 when a blue light or an ultraviolet light is respectively emitted into the first fluorescent layer 31 and the second fluorescent layer 32. For example, the first fluorescent layer emits red light when blue light enters the first fluorescent layer 31, and the second fluorescent layer emits green light when blue light enters the second fluorescent layer 32.

In addition, the first fluorescent layer 31 may be made by mixing red phosphor in a silicone material, and the second fluorescent layer 32 may be made by mixing green phosphor in a silicone material.

The LED chips 1 may be LED chips emitting blue light of wavelengths within range 380 nm to 460 nm. The green light emitted from the second fluorescent layer 31 may be within range 500 nm to 560 nm. The red light emitted from the first fluorescent layer 32 may be within 600 nm to 670 nm.

Some blue light is not absorbed by either the first fluorescent layer 31 or the second fluorescent layer 32. Therefore, in some embodiment, the overall output light includes blue light, red light and green light, which together form a white light.

With such design, green light is not consumed by red phosphor material and further improves CRI (color rendering index) and overall luminous efficacy.

Please be noted that the embodiment is only for explaining the inventive concept, instead of limiting the inventive scope. Other variations may be made by persons of ordinary skilled in the art based on disclosure of this specification.

The bracket 2 may be SMD bracket made of PCT material, a mixture of CHDM (1,4-Cyclohexanedimethanol) and DMT (Terephthalic acid dimethyl ester).

Figure 5:
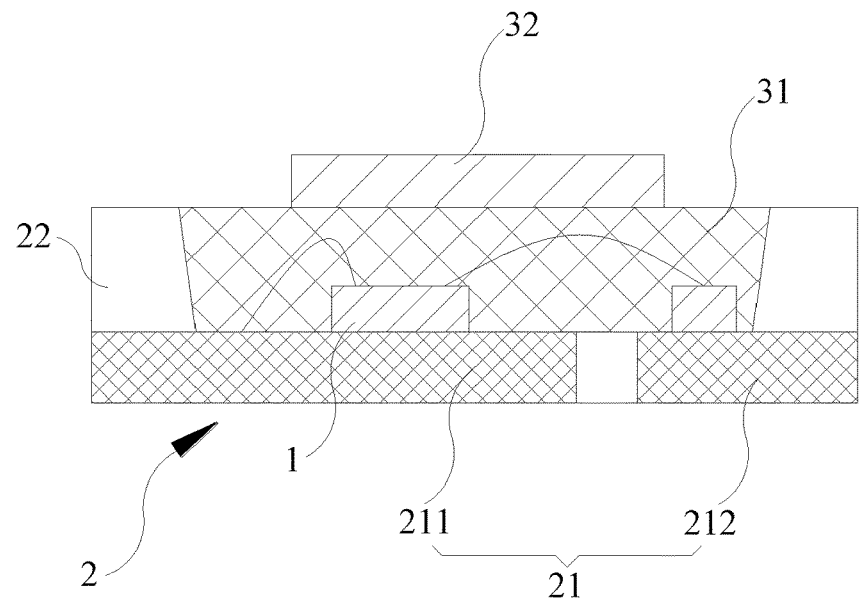
FIG. 5 illustrates a first way to add a second fluorescent layer.
Figure 6:
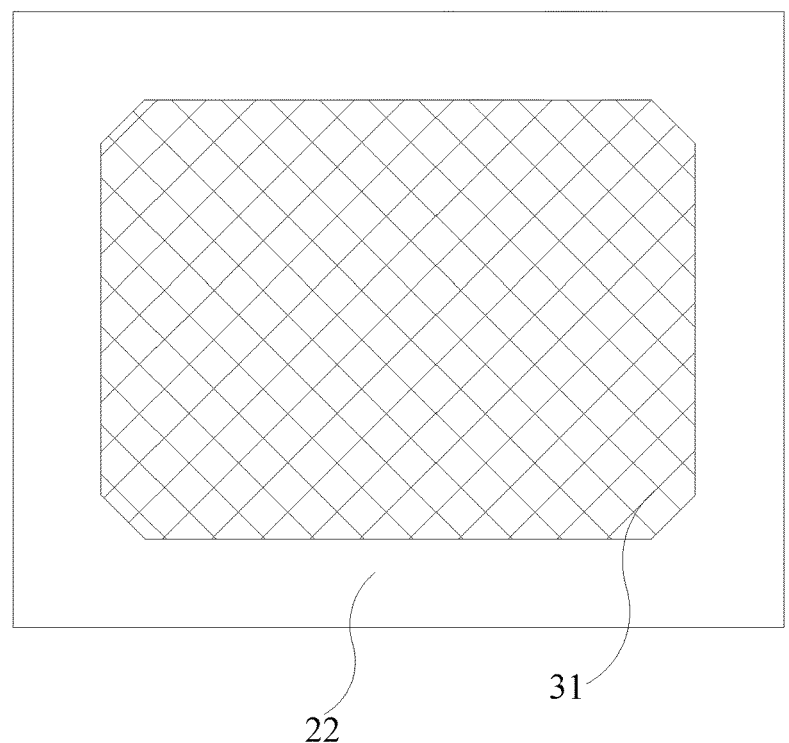
FIG. 6 illustrates a top view of FIG. 5.

Please refer to FIG. 5 and FIG. 6. In one embodiment, the first fluorescent layer 31 is disposed in the containing space 23. The top surface of the second side of the first fluorescent layer 31 is aligned with the top surface of the side walls 22.

The first side of the second fluorescent layer 32 is placed on top of the first fluorescent layer 31. The size of the second side of the second fluorescent layer 32 is smaller than the size of the second side of the first fluorescent layer 31. Therefore, part of the first fluorescent layer 31 is exposed and uncovered by the second fluorescent layer 32.

Figure 7:
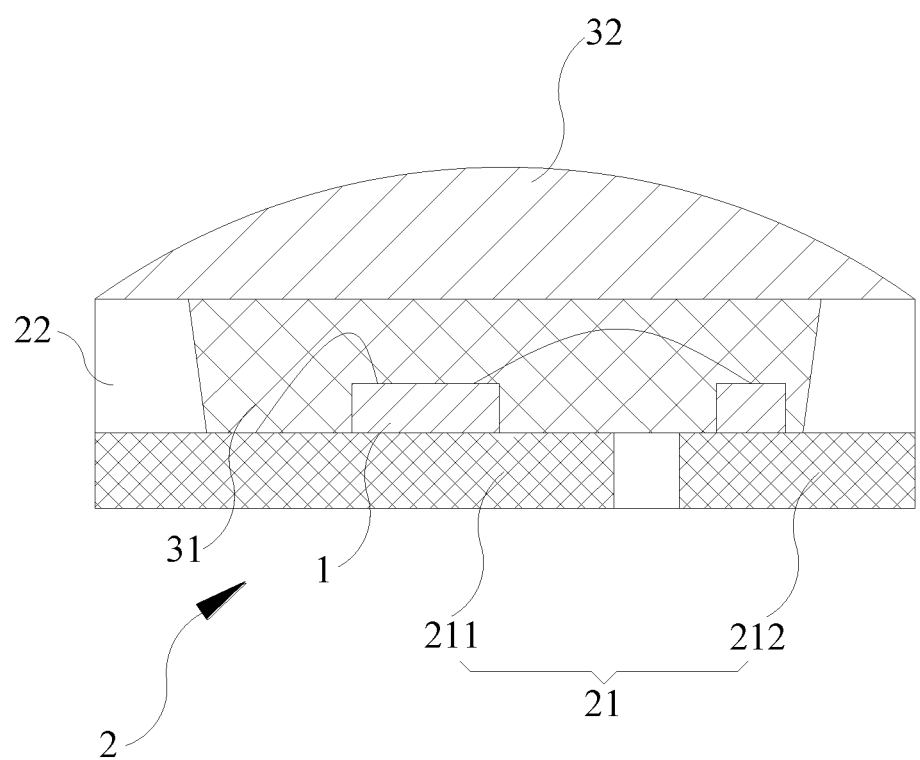
FIG. 7 illustrates another way to add a second fluorescent layer.
Figure 8:
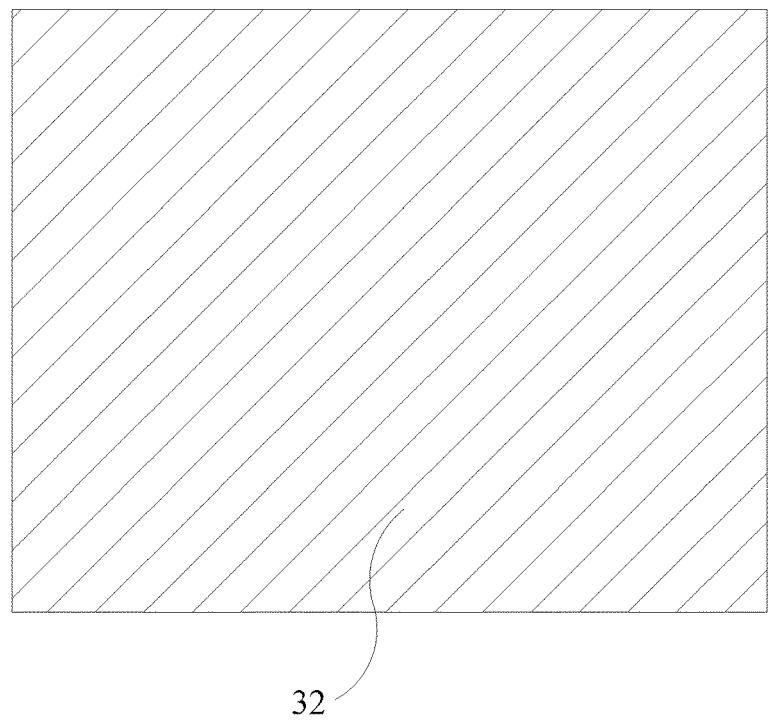
FIG. 8 illustrates a top view of FIG. 7.
Figure 9:
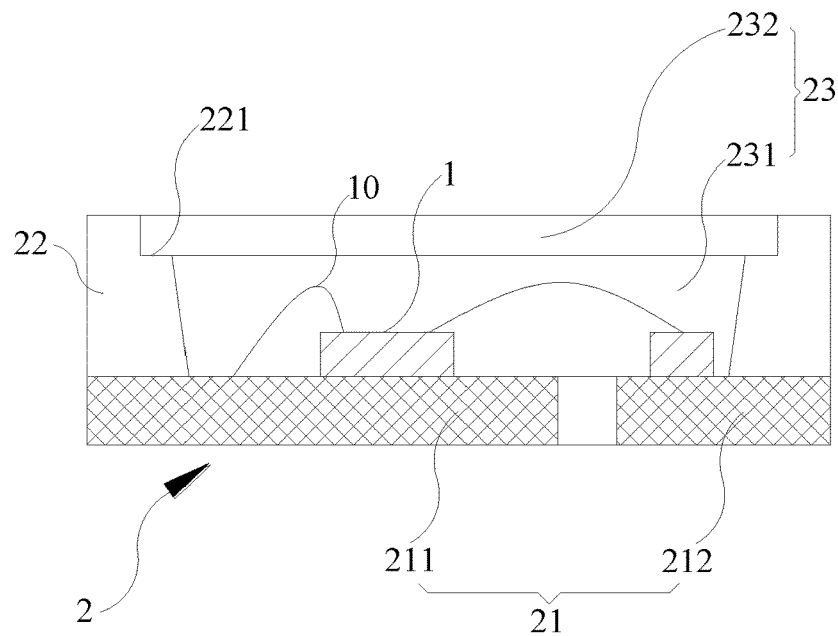
FIG. 9 illustrates another way to add a second fluorescent layer.
Figure 10:
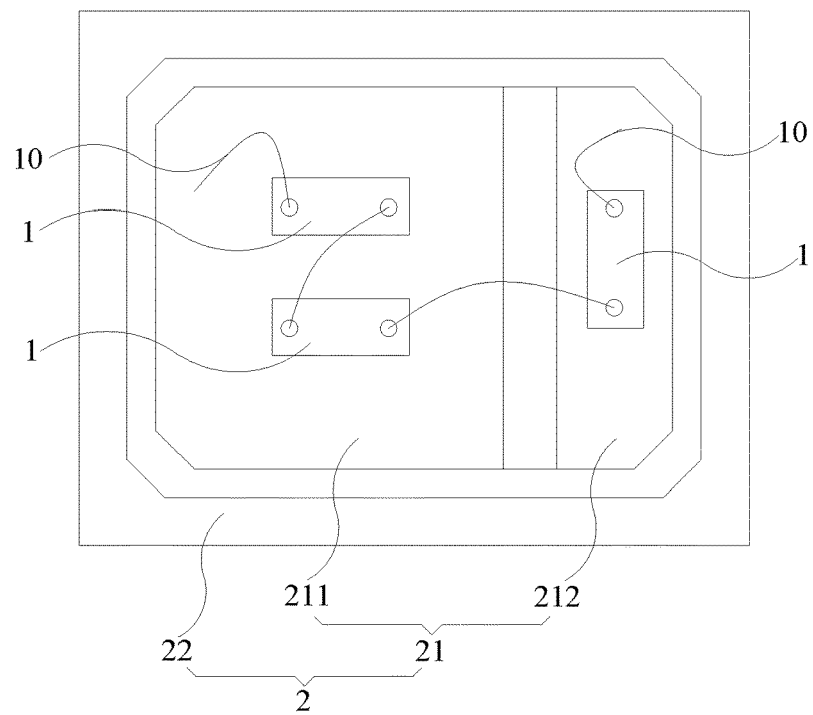
FIG. 10 illustrates LED chips in an embodiment.
Figure 11:
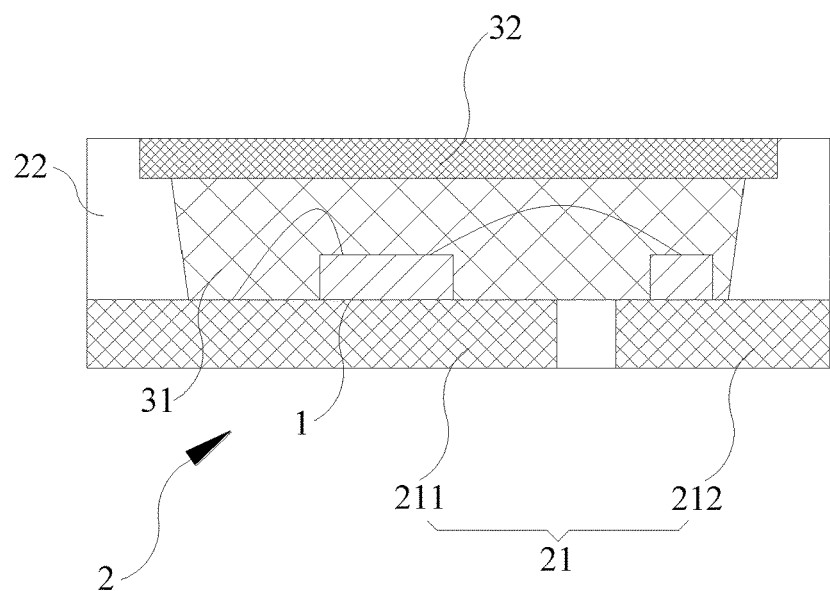
FIG. 11 illustrates another side view of a LED device embodiment.
Figure 12:
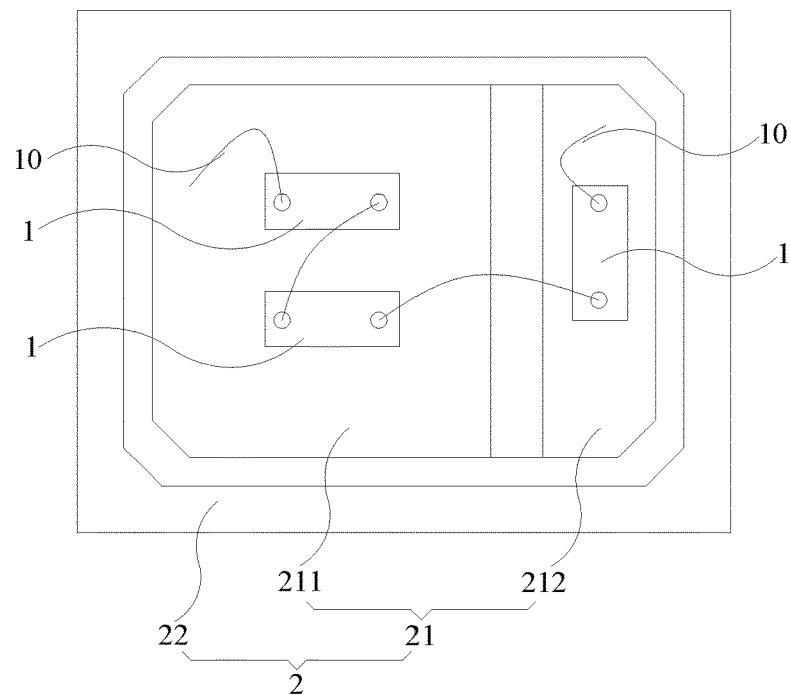
FIG. 12 illustrates a top view of a LED device embodiment.

Please refer to FIG. 7 and FIG. 8, which illustrate another way to add the second fluorescent layer.

In this embodiment, the first fluorescent layer 31 is placed in the containing space 23. The top surface of the first fluorescent layer 31 is aligned with the top surface of the side walls 22. The second fluorescent layer 32 is placed upon the first fluorescent layer 31.

In this embodiment, the second side of the second fluorescent layer 32 has a curve surface. The angle between the first side and the second side of the second fluorescent layer 32 is smaller than 60 degrees.

Please refer to FIG. 9 to FIG. 12.

In this embodiment, the side walls 22 have a ladder structure 221 for dividing the containing space 23 to a first containing space 231 and a second containing space 232.

The area of the second containing space 232 is larger than the area of the first containing space 231. The first fluorescent layer 31 is placed in the first containing space 231 and the second fluorescent layer 32 is placed in the second containing space 232.

Figure 13:
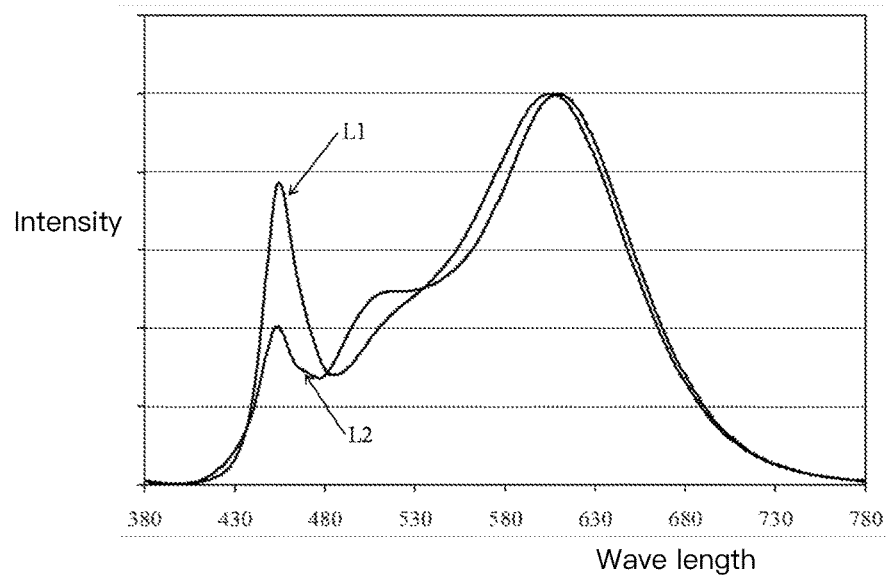
FIG. 13 illustrates a optical characteristic diagram of an experimental result.
Figure 14:
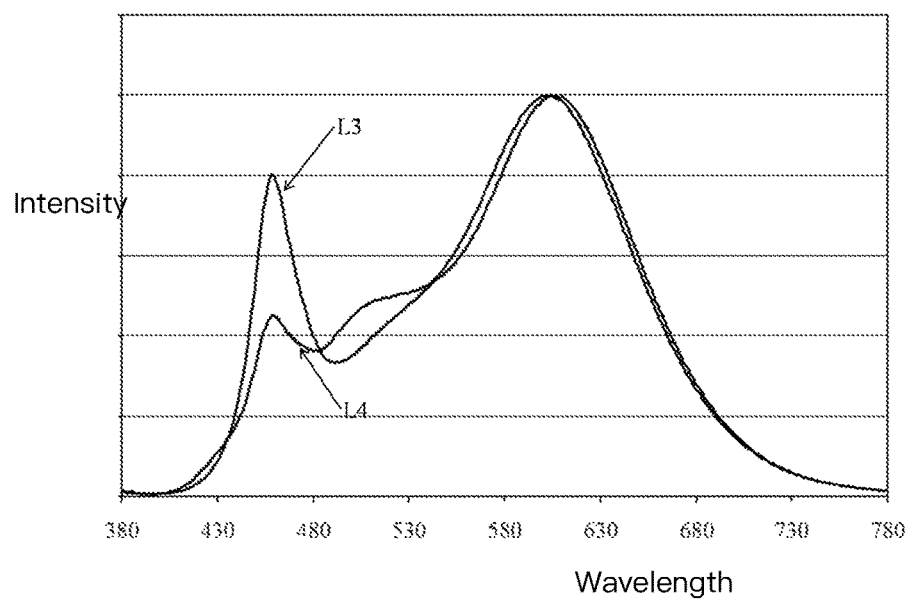
FIG. 14 illustrates another optical characteristic diagram of an experimental result.

Please refer to FIG. 13 and FIG. 14, which illustrate experimental results of such design.

FIG. 13 illustrate a conventional LED optical characteristic, while FIG. 14 illustrates optical characteristic of an example of the invention. It is clearly seen that the green light is well improved, which may increase overall CRI and luminous efficacy. Meanwhile, blue light is decreased to protect human eyes.

In addition to the above-described embodiments, various modifications may be made, and as long as it is within the spirit of the same invention, the various designs that can be made by those skilled in the art are belong to the scope of the present invention.

The invention claimed is:

1. A LED device, comprising:
   a LED module mounted on a substrate for emitting a blue light;
   a first fluorescent layer with a first side facing to the LED module for converting the blue light to a red light;
   a second fluorescent layer having a first side attached to a second side of the first fluorescent layer for converting the blue light to a green light emitted from a second side of the second fluorescent layer; and
   a package housing for holding the substrate and the first fluorescent layer, wherein the package housing has a ladder wall for engaging with a peripheral part of the second fluorescent layer.

2. The LED device of claim 1, wherein the LED module has multiple LED chips emitting the blue light, the substrate has a first terminal area and a second terminal area for mounting the multiple LED chips, the first terminal area and the second terminal area are provided for respectively connected to a positive terminal and a negative terminal of a power source.

3. The LED device of claim 1, wherein the first fluorescent comprises red phosphor material contained in first silicone part, the second fluorescent layer comprises green phosphor material contained in a second silicone part, and wherein a part of the green light excites the red phosphor if the green light hits the red phosphor.

4. The LED device of claim 3, wherein a first volume ratio of the red phosphor to the first silicone part is larger than a second volume ratio of the green phosphor to the second silicone part.

5. The LED device of claim 3, wherein a first volume ratio of the red phosphor to the first silicone part is smaller than a second volume ratio of the green phosphor to the second silicone part.

6. The LED device of claim 1, wherein a thickness of the first fluorescent layer is larger than a thickness of the second fluorescent layer.

7. The LED device of claim 1, wherein a thickness of the first fluorescent layer is smaller than a thickness of the second fluorescent layer.

8. The LED device of claim 1, wherein the first fluorescent layer has better heat resisting feature than the second fluorescent layer.

9. The LED device of claim 1, wherein the package housing has a bottom part fixed to the substrate and the package housing has a surrounding wall extended from the bottom part, the wall defines a containing space for holding the first fluorescent layer.

10. The LED device of claim 9, wherein a second side of the second fluorescent layer has a curved surface.

11. The LED device of claim 10, wherein an angle of edges of the first side and the second side of the second fluorescent layer is less than 60 degrees.

12. The LED device of claim 10, wherein the curve surface forms a convex lens.

13. The LED device of claim 1, wherein area of the second side of the second fluorescent layer is smaller than area of the second side of the first fluorescent layer.

14. The LED device of claim 13, wherein a part of the second side of the first fluorescent layer is exposed and uncovered by the second fluorescent layer.

15. The LED device of claim 14, wherein the second side of second fluorescent layer is surrounded by the second side of the first fluorescent layer from a top view.

16. The LED device of claim 1, wherein the second side of the second fluorescent layer forms a flat surface.

17. The LED device of claim 1, wherein the second side of second florescent layer forms a curve surface.

18. The LED device of claim 1, wherein the second side of the second fluorescent layer has multiple convex part corresponding to multiple underlying LED chips of the LED module.

19. The LED device of claim 1, wherein the LED module is mounted on the substrate with surface mount device (SMD) technology.

* * * * *